United States Patent [19]

Zimmerman

[11] 4,089,733
[45] May 16, 1978

[54] METHOD OF FORMING COMPLEX SHAPED METAL-PLASTIC COMPOSITE LEAD FRAMES FOR IC PACKAGING

[75] Inventor: Richard Henry Zimmerman, Palmyra, Pa.

[73] Assignee: AMP Incorporated, Harrisburg, Pa.

[21] Appl. No.: 772,205

[22] Filed: Feb. 25, 1977

Related U.S. Application Data

[63] Continuation-in-part of Ser. No. 612,889, Sep. 12, 1975, abandoned.

[51] Int. Cl.² ............... B44C 1/22; C03C 15/00; C03C 25/06; C23F 1/02
[52] U.S. Cl. .................. 156/630; 156/634; 156/656; 156/659; 174/52 R
[58] Field of Search ............ 156/630, 632, 634, 656, 156/659, 902; 29/576 T, 591; 174/52; 357/70, 69

[56] References Cited

U.S. PATENT DOCUMENTS

| 3,539,259 | 11/1970 | Hillman et al. | 174/52 X |
| 3,611,061 | 10/1971 | Segerson | 174/52 PE |
| 3,676,748 | 7/1972 | Kobayashi et al. | 357/70 X |
| 3,711,625 | 1/1973 | Dupuls | 174/52 PE |
| 3,763,404 | 10/1973 | Aird | 174/52 PE |

Primary Examiner—William A. Powell
Attorney, Agent, or Firm—Russell J. Egan

[57] ABSTRACT

A method is disclosed for forming complex shaped, metal-plastic composite lead frame structures for integrated circuit packaging. The lead frame pattern is formed on a metallic substrate having a profiled plastic member bonded thereto at such location as to hold the complexed shaped metal lead portions in a fixed spaced arrangement. The subject method results in substantial economies in reduced usage of plastics material and yet a high grade product having reliably positioned leads.

5 Claims, 6 Drawing Figures

METHOD OF FORMING COMPLEX SHAPED METAL-PLASTIC COMPOSITE LEAD FRAMES FOR IC PACKAGING

CROSS REFERENCE TO RELATED APPLICATION

The present application is a continuation-in-part of my application Ser. No. 612,889 filed Sept. 12, 1975, now abandoned.

BACKGROUND OF THE INVENTION

The Field of the Invention

The present invention relates to a method for producing lead frame devices for integrated circuits and in particular to lead frames having a metal-plastic composite structure.

There are a number of well known methods for making lead frames for integrated circuit devices, such as the method and resulting product described in U.S. Pat. No. 3,440,027. The method disclosed comprises bonding a metal layer to a plastic substrate, coating the metal with a photo resist material, imaging and developing the desired lead frame pattern on the photo resist, and subjecting the prepared strip to an etching process to etch away the excess metal portions. While this method has been demonstrated as being feasible, there are certain problems which are inherent therewith including the fact that stress is built up in the plastic laminate during subsequent processing, handling and bonding operations which can result in misplaced leads and/or defective bonds. This method also requires the use of a substantial amount of fabricated plastic film, which adds to the cost and requires the additional processing steps of slitting, coating, laminating, etc., in order to utilize the final packaging method. Further, only the IC chip bonding schemes which can be utilized are those which can be carried out at lower temperatures compatible with the plastic substrate.

Improvements over the above-discussed patent can be found in U.S. Pat. Nos. 3,686,991, and 3,763,404 in which the lead portions of a lead frame pattern are formed extending out over central apertures in the plastic substrate in a cantilever fashion in what is generally referred to as a beam-over-hole configuration. This structural arrangement can result in a reduction in the stresses applied to the various leads when they are subjected to a subsequent bonding step and allows for direct metal to metal heating for higher temperature bonding operation. However, the cantilever beams extending a substantial distance over the hole are readily deformed and misaligned during processing and shipping so that there can be a significant reject factor driving up the cost of such devices.

SUMMARY OF THE PRESENT INVENTION

The present invention concerns an improved method for forming metal-plastic composite lead frames for IC chip packaging by forming a profiled configuration of plastic material on a first side of a metallic substrate, photo imaging the desired lead frame pattern on the opposite side of the metallic substrate at locations in alignment with the plastic material, and etching the substrate to form the lead frame including a plurality of cantilever leads joined near their free ends by the plastics material.

It is an object of the present invention to reduce the amount of plastic material used in forming a metal-plastic composite lead frame device and thus effect substantial economy in manufacture.

It is a further object of the present invention to produce an improved lead frame having a plurality of cantilever beams held together near their free ends by a minimal amount of plastic material.

It is a further object of the present invention to teach an improved method of forming a metal-plastic composite lead frame which is suitable for high speed production techniques.

It is a further object of the present invention to teach a method of manufacturing metal-plastic composite lead frames which obviates the need for laminating a layer of metal on plastic.

It is yet another object of the present invention to teach an improved method for manufacturing metal-plastic composite lead frames which can be readily and economically followed.

The means for accomplishing the foregoing objects and other advantages will become apparent to those skilled in the art from the following detailed description taken with reference to the accompanying drawings.

DETAILED DESCRIPTION OF THE PRESENT INVENTION

Figure 1:
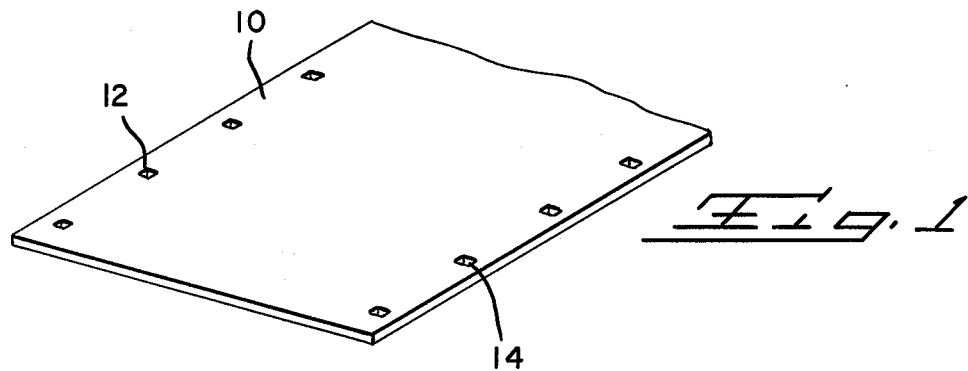
FIG. 1 is a perspective view of a metallic web according to the present invention.
Figure 2:
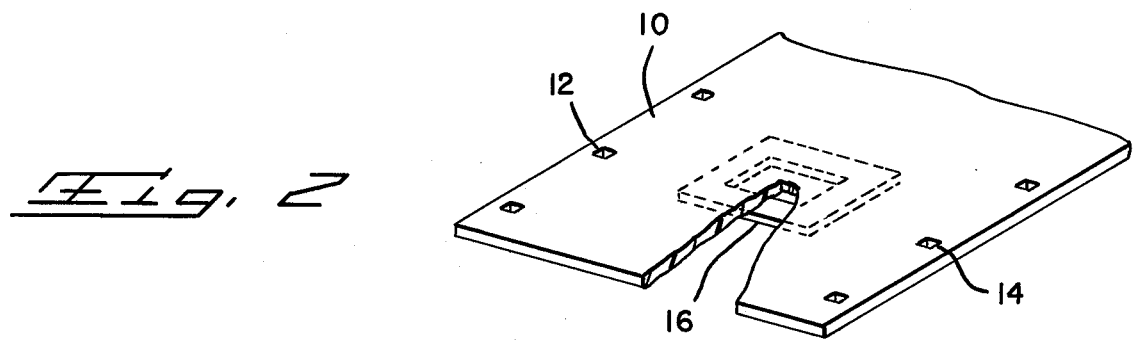
FIG. 2 is a perspective view, partially broken away, of the web of FIG. 1 having a configuration of plastic material deposited on a first side thereof.
Figure 3:
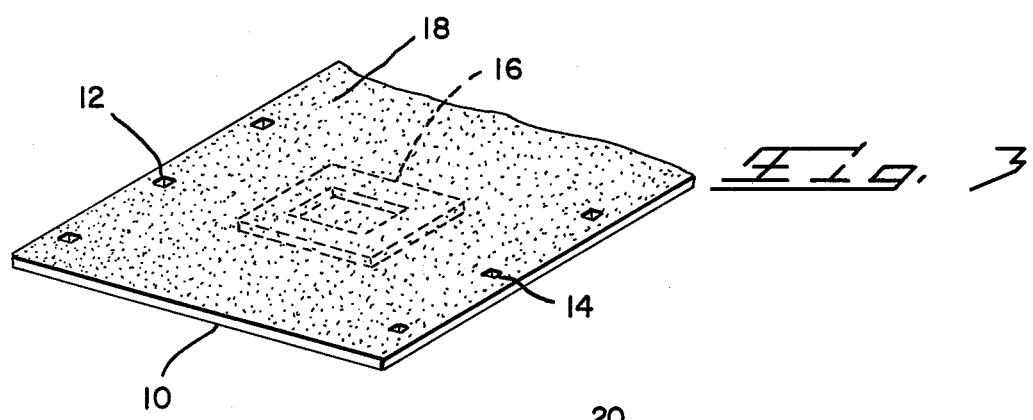
FIG. 3 is a perspective view of the web of FIGS. 1 and 2 after the second side has been coated with a photo resist material.
Figure 4:
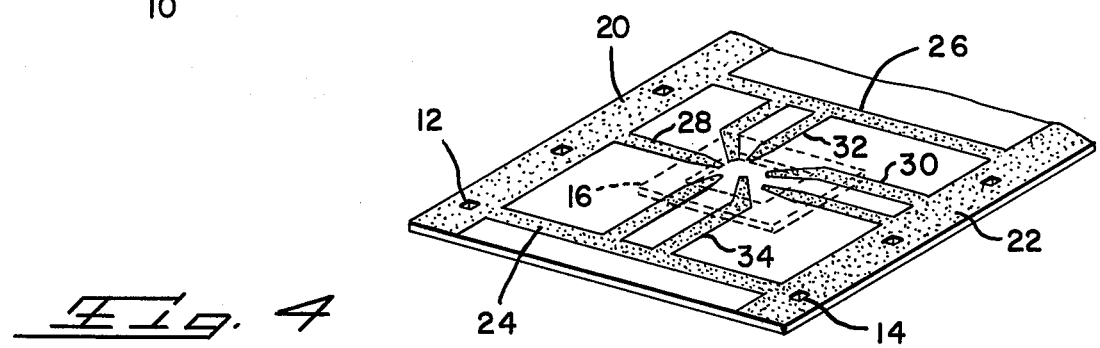
FIG. 4 is a perspective view of the web of FIGS. 1 to 3 after photo imaging a lead frame pattern on the second side.
Figure 5:
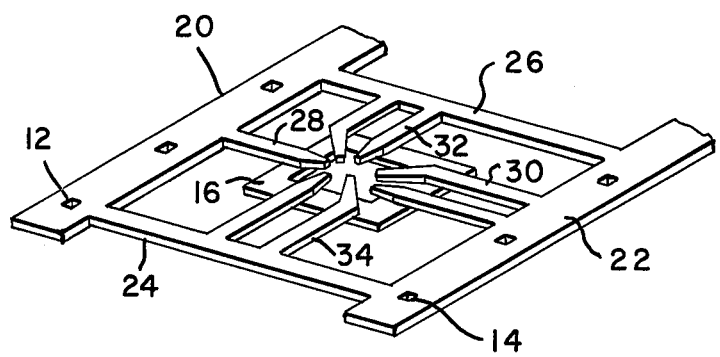
FIG. 5 is a perspective view of a single lead frame formed in the web of FIGS. 1 to 4 according to the present invention.

The steps of the subject method are shown in FIGS. 1 to 5 forming a single exemplary lead frame of a continuous strip of like lead frames. A continuous web of an etchable metal 10, such as copper foil in the range of 0.7 to 2.8 mils thickness, is prepared by a slitting operation to an overall width in the range of from 8 to 70 millimeters. A plurality of spaced alignment apertures 12, 14 are formed in the web 10 in rows spaced apart along opposite marginal edges of the web. A thin profiled configuration of electrically insulating plastic material 16, such as polyimide, photosensitive polymer, epoxes or other plastics having suitable strength character, is deposited on a first side of the metal foil accurately positioned with respect to the alignment holes 12, 14 in the web 10. The plastic material 16 can be deposited by conventional printing means, such as silk screening, or can be preformed and bonded to the web by means of known adhesives. The plastic material preferably has an annular configuration, is of lesser overall dimensions than the web, and is relatively thin on the order of 1 to 6 mils in thickness. The opposite side of the web 10 is coated with a photo resist material 18, such as Shipley AZ-340 or DuPont Resiston 2, and imaged with the desired, complex lead frame pattern. The web is chemically etched in a conventional manner in a known etchant solution, such as ferric chloride; Shipley V-1 or Q-Pex by Conversion Chemical Co. The resulting lead frame, as shown in the exemplary embodiment of FIG. 5, has a configuration which includes two parallel, spaced carrier strips 20, 22 interconnected by cross bar portions 24, 26 and with a plurality of cantilever beam leads 28, 30, 32, 34 extending from the carrier strips and cross bar portions, respectively, and extending across the plastic material 16. Thus the leads will be held at one end by their continuation with the metallic web and adjacent their free ends by the plastic material 16 which is bonded thereto.

The present method substantially reduces the amount of plastic material previously required in metal-plastic composite lead frames, such as the previously discussed prior art. This savings is accomplished by the reduced dimensions and thickness of the plastic contrary to the teachings of such prior art as U.S. Pat. No. 3,689,991. The savings realized are quite substantial since proportionately the relative cost of a square inch of a plastic substrate to copper foil is approximately 3 to 1. This factor is even more significant since only the copper inner finger pattern is utilized, after chip attachment, and therefore the greatest bulk of the plastic substrate is discarded having served only as a carrier and transport mechanism. Thus the present invention implies a method for reducing the amount of the expensive material and yet yielding a lead frame having the desired characteristics of a beam-over-hole type arrangement.

Figure 6:
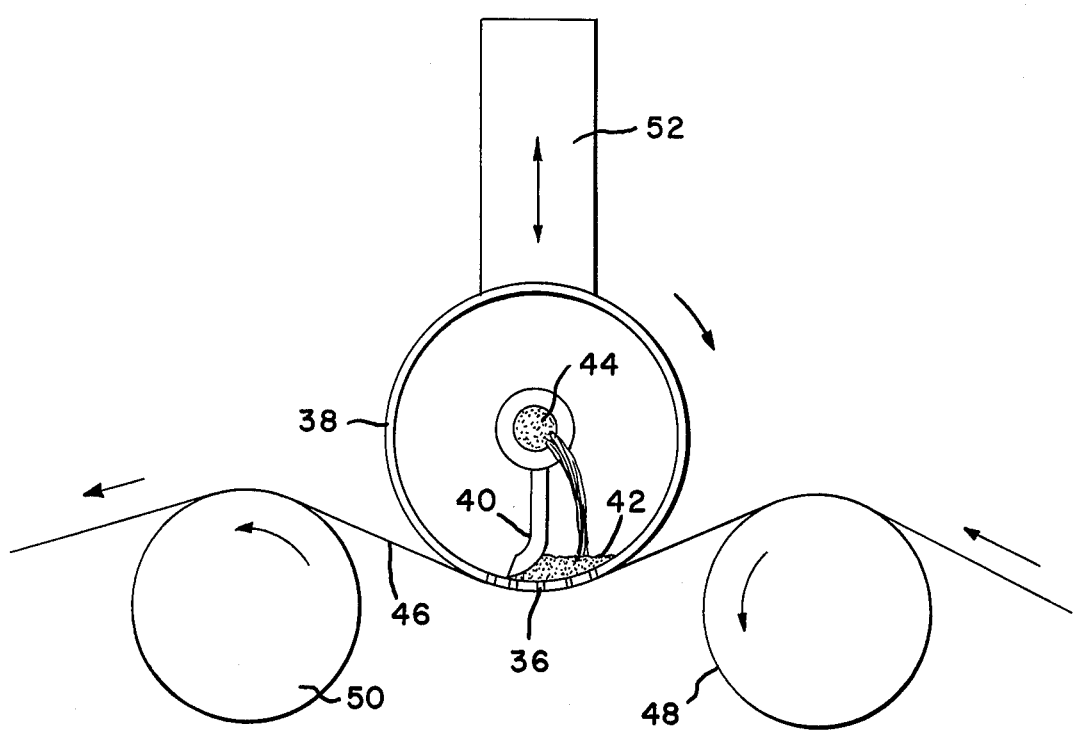
FIG. 6 is a side elevation, partially in section, of a continuous screen printer for depositing the plastic material on the first side of the web.

The above discussed method step of applying the plastic material to the web could be carried out by a continuous screen printer such as the one illustrated in FIG. 6. A screen 36 prepared by conventional techniques is mounted onto a hollow drum 38 of an appropriate diameter (depending upon the "repeat length" desired). A squeegee blade 40 is mounted in a fixed position within the drum in such a manner as to wipe the ink 42 through the openings in the screen, and an ink supply is fed from conduit 44 to in front of the squeegee where it will maintain the reservoir of ink required by the squeegee. In use, this screen printing drum will rotate in contact with and in accurate speed synchronization with the web 46 being printed. Two support rolls 48, 50, on the opposite side of the continuously moving web, will support the web. The position of the printing roll, relative to the two support rolls, is adjustable by means 52 or, conversely, the support rolls may be moved to vary the tension applied to the web.

As a further alternative a reverse image of the desired polyimide pattern can be printed upon clean copper foil web using an imiodophobic ink. Then the polyimide solution is doctor-bladed on the web. The solution will not take on the ink and thus a pattern will be formed which then can be cured to the copper. During the process of curing the polyimide, the ink would vaporize.

The present invention may be subject to many changes and modifications without departing from the spirit or essential characteristics thereof. The present embodiment is therefore intended in all respects to be illustrative and not restrictive as to the scope of the invention.

What is claimed is:

1. A method of producing a metal-plastic composite lead frame device for integrated circuit packaging, said lead frame device having a plurality of cantilever metal leads held in fixed alignment near their free ends by a member of plastics material, comprising the steps of:

perforating a continuous web of metallic foil with a plurality accurately spaced registration apertures along at least one marginal edge thereof;

depositing on a first side of said foil a pattern of thin, electrically insulating plastic material accurately aligned with respect to said apertures, said pattern having lesser overall dimensions than said web;

coating the opposite side of said foil with a photo resist material;

imaging a lead frame pattern on said photo resist at accurately aligned positions with respect to said apertures;

developing said imaged lead frame pattern; and passing said strip through an etching bath whereby said strip will be etched away leaving only a lead frame with the leads supported by said plastics material.

2. A method according to claim 1 wherein said pattern of electrically insulating plastic material is printed on said metal foil and has a thickness in the range of 1 to 3 mils.

3. A method according to claim 1 wherein said pattern of electrically insulating plastic material is preformed and bonded to said metal foil and has a thickness in the range of 2 to 6 mils.

4. A method according to claim 1 wherein said plastic material is selected from the group including polyimides, photosensitive polymers and epoxes.

5. A method according to claim 1 wherein said metallic foil is copper having a thickness in the range of 0.7 to 2.8 mils.

* * * * *

Notice of Adverse Decision in Interference

In Interference No. 100,454, involving Patent No. 4,089,733, R. H. Zimmerman, METHOD OF FORMING COMPLEX SHAPED METAL-PLASTIC COMPOSITE LEAD FRAMES FOR IC PACKAGING, final judgment adverse to the patentee was rendered Oct. 21, 1983, as to claims 1–5.
[*Official Gazette March 13, 1984.*]